US011016385B2

United States Patent
Yang et al.

(10) Patent No.: US 11,016,385 B2
(45) Date of Patent: May 25, 2021

(54) PHOTOSENSITIVE ADHESIVE COMPOSITION, PHOTOSENSITIVE CONDUCTIVE ADHESIVE COMPOSITION, AND ELECTRONIC DEVICE CONTAINING PHOTOSENSITIVE CONDUCTIVE ADHESIVE COMPOSITION

(71) Applicant: Industrial Technology Research Institute, Hsinchu (TW)

(72) Inventors: Yi-Chi Yang, New Taipei (TW); Shou-Yi Ho, New Taipei (TW); Kuo-Chan Chiou, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 128 days.

(21) Appl. No.: 16/224,812

(22) Filed: Dec. 19, 2018

(65) Prior Publication Data
US 2020/0064736 A1    Feb. 27, 2020

(30) Foreign Application Priority Data
Aug. 21, 2018 (TW) ................. 107129097

(51) Int. Cl.
| | | |
|---|---|---|
| *G03F 7/027* | (2006.01) | |
| *G03F 7/033* | (2006.01) | |
| *G03F 7/085* | (2006.01) | |
| *G03F 7/004* | (2006.01) | |
| *C09J 4/00* | (2006.01) | |
| *C09J 165/04* | (2006.01) | |
| *G03F 7/032* | (2006.01) | |
| *G03F 7/021* | (2006.01) | |
| *C08K 3/38* | (2006.01) | |
| *C08K 3/28* | (2006.01) | |
| *C08F 16/32* | (2006.01) | |
| *C08G 61/04* | (2006.01) | |
| *C08K 3/14* | (2006.01) | |
| *C08K 3/22* | (2006.01) | |

(52) U.S. Cl.
CPC .............. *G03F 7/0043* (2013.01); *C09J 4/00* (2013.01); *C09J 165/04* (2013.01); *G03F 7/0045* (2013.01); *G03F 7/027* (2013.01); *G03F 7/0212* (2013.01); *G03F 7/032* (2013.01); *G03F 7/033* (2013.01); *G03F 7/085* (2013.01); *C08F 16/32* (2013.01); *C08G 61/04* (2013.01); *C08G 2261/143* (2013.01); *C08K 3/14* (2013.01); *C08K 3/22* (2013.01); *C08K 3/28* (2013.01); *C08K 3/38* (2013.01); *C08K 2003/282* (2013.01); *C08K 2003/382* (2013.01); *C08K 2201/001* (2013.01); *C08L 2203/20* (2013.01)

(58) Field of Classification Search
CPC ........ G03F 7/032; G03F 7/085; G03F 7/2051; G03F 7/0043; G03F 7/0212; G03F 7/027; G03F 7/033; C09J 4/00; C09J 125/08; C09J 133/24; C09J 133/26; C09D 133/24; C09D 133/26
See application file for complete search history.

(56) References Cited

U.S. PATENT DOCUMENTS

| | | | |
|---|---|---|---|
| 4,857,562 A | 8/1989 | Wacker et al. | |
| 6,106,999 A * | 8/2000 | Ogiso | G03F 7/029 430/281.1 |
| 6,610,759 B1 | 8/2003 | Chappelow et al. | |
| 8,133,945 B2 | 3/2012 | Arima et al. | |
| 8,742,025 B2 | 6/2014 | Jung et al. | |
| 2004/0002562 A1* | 1/2004 | Schmidhauser | C08F 8/32 524/284 |
| 2004/0146799 A1* | 7/2004 | Miyamoto | B41C 1/1008 430/138 |
| 2006/0194029 A1* | 8/2006 | Tsujihata | C09D 151/003 428/195.1 |
| 2008/0044764 A1* | 2/2008 | Takahashi | G03F 7/0392 430/280.1 |
| 2008/0250972 A1 | 10/2008 | Oldenzijl | |
| 2009/0088492 A1 | 4/2009 | Yokoi | |
| 2010/0048756 A1 | 2/2010 | Loccufier et al. | |

FOREIGN PATENT DOCUMENTS

| | | |
|---|---|---|
| CN | 1555405 | 12/2004 |
| CN | 102112096 | 6/2011 |
| TW | I322172 | 3/2010 |
| TW | 201706327 | 2/2017 |

OTHER PUBLICATIONS

"Office Action of Taiwan Counterpart Application," dated Apr. 12, 2019, p. 1-p. 10.

* cited by examiner

*Primary Examiner* — John S Chu
(74) *Attorney, Agent, or Firm* — JCIPRNET

(57) ABSTRACT

The disclosure provides a photosensitive adhesive composition including 10 parts by weight to 90 parts by weight of a monomer having a vinyl ether functional group, 10 parts by weight to 90 parts by weight of a tertiary amine polymer, and 0.5 parts by weight to 10 parts by weight of a photoacid initiator. The weight-average molecular weight of the tertiary amine polymer is between 2000 and 20000. The disclosure also provides a photosensitive conductive adhesive composition and an electronic device containing the photosensitive conductive adhesive composition.

16 Claims, 1 Drawing Sheet

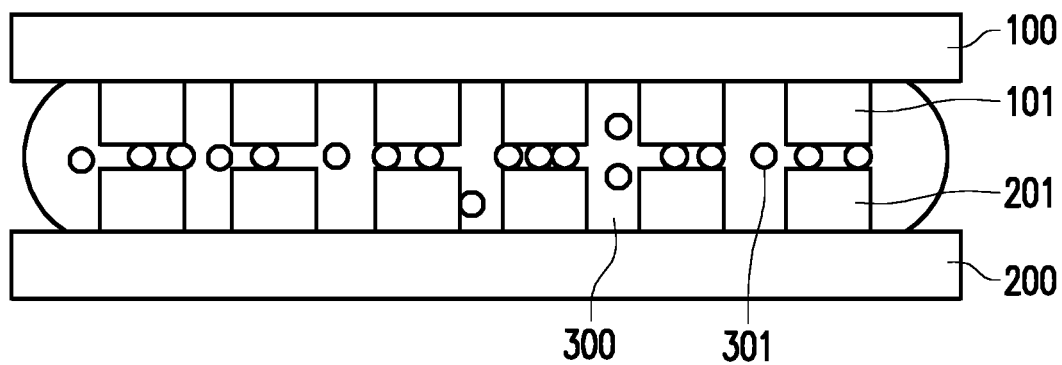

PHOTOSENSITIVE ADHESIVE COMPOSITION, PHOTOSENSITIVE CONDUCTIVE ADHESIVE COMPOSITION, AND ELECTRONIC DEVICE CONTAINING PHOTOSENSITIVE CONDUCTIVE ADHESIVE COMPOSITION

CROSS REFERENCE TO RELATED APPLICATION

This application claims the priority benefit of Taiwan application serial no. 107129097, filed on Aug. 21, 2018. The entirety of the above-mentioned patent application is hereby incorporated by reference herein and made a part of specification.

TECHNICAL FIELD

The disclosure relates to a photosensitive adhesive composition, and more particularly, to a photosensitive adhesive composition, a photosensitive conductive adhesive composition, and an electronic device including the photosensitive conductive adhesive composition.

BACKGROUND

In recent years, the photosensitive adhesive composition has been widely used in display assembly or OLED (organic light-emitting diode) lighting packaging materials. Instead of curing the composition via conventional heating, baking, and thermal curing, the photosensitive adhesive composition only needs to be cured via the irradiation of light rays such as external UV, electron beam, infrared, X-ray and the like, and is suitable for a heat-sensitive flexible polymer substrate. Therefore, the photosensitive adhesive composition is gradually replacing the thermosetting composition for applications on flexible printed electronics. At the same time, the photosensitive adhesive composition has the advantages of shorter process time, simplified equipment and so on.

However, in the currently-used photosensitive curing adhesive, external light irradiation causes the photoinitiator in the adhesive to rapidly pyrolyze, and a crosslinking reaction occurs between the resins such that the adhesive is rapidly cured. Moreover, with the requirements of multilayer stacking and repeated processing between devices on a package or in an OLED process, if the devices are directly adhered on the photosensitive adhesive and then irradiated by external light, the adhesive cannot be completely cured due to the devices shielding the light irradiating the photosensitive adhesive composition. As a result, reliability issues in the adhesion of a backend device or the packaging material occur.

Therefore, a photosensitive adhesive composition having photosensitive delayed curing characteristics is urgently needed, which may be first coated on a substrate, and then external energy is applied to the photosensitive adhesive composition and a backend device aligned and attached. Lastly, the photosensitive adhesive composition is gradually cured and has good adhesion.

SUMMARY

An embodiment of the disclosure provides a photosensitive adhesive composition including 10 parts by weight to 90 parts by weight of a monomer having a vinyl ether functional group, 10 parts by weight to 90 parts by weight of a tertiary amine polymer, and 0.5 parts by weight to 10 parts by weight of a photoacid initiator. The weight-average molecular weight of the tertiary amine polymer is between 2000 and 20000.

Another embodiment of the disclosure provides a photosensitive conductive adhesive composition including a conductive powder and a photosensitive adhesive composition. The photosensitive adhesive composition includes 10 parts by weight to 90 parts by weight of a monomer having a vinyl ether functional group, 10 parts by weight to 90 parts by weight of a tertiary amine polymer, and 0.5 parts by weight to 10 parts by weight of a photoacid initiator. The weight-average molecular weight of the tertiary amine polymer is between 2000 and 20000.

Another embodiment of the disclosure provides an electronic device including a first substrate having a first electrode, a second substrate having a second electrode, and a photosensitive conductive adhesive composition disposed between the first substrate and the second substrate, and the first electrode and the second electrode are electrically connected via the photosensitive conductive adhesive composition, wherein the photosensitive conductive adhesive composition includes a conductive powder and a photosensitive adhesive composition. The photosensitive adhesive composition includes 10 parts by weight to 90 parts by weight of a monomer having a vinyl ether functional group, 10 parts by weight to 90 parts by weight of a tertiary amine polymer, and 0.5 parts by weight to 10 parts by weight of a photoacid initiator. The weight-average molecular weight of the tertiary amine polymer is between 2000 and 20000.

Several exemplary embodiments accompanied with FIGURES are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1 is a schematic of an electronic device of an embodiment of the disclosure.

DETAILED DESCRIPTION OF DISCLOSED EMBODIMENTS

Hereinafter, embodiments of the disclosure are described in detail. The details provided in the embodiments are exemplary, and are not intended to limit the scope of the disclosure. Those having ordinary skill in the art may modify or change the details according to the requirements of actual implementation. "One" in the disclosure represents "at least one".

An embodiment of the disclosure provides a photosensitive adhesive composition including a vinyl ether monomer, a tertiary amine structure polymer, and a photoacid initiator. Upon exposure to external energy, the photoacid initiator begins to pyrolyze and form an $H^+$ cationic group and a negatively-charged photoacid salt. The $H^+$ cation first generates a force similar to electric dipole with a lone pair of electrons on the nitrogen atom of a tertiary amine polymer structure. The magnitude of the electric dipole force is the key to influence the delayed curing of the photosensitive composition. When the composition is just irradiated with energy, the force reduces the double bond reaction of the $H^+$ ion on the vinyl ether functional group; however, as the external environment interferes, the force is gradually weakened. At this time, the H+ ion begins an addition reaction to the double bond of the vinyl ether functional group and begins to cure the photosensitive composition.

According to several embodiments of the disclosure, a photosensitive adhesive composition of the disclosure includes 10 parts by weight to 90 parts by weight of a monomer having a vinyl ether functional group, 10 parts by weight to 90 parts by weight of a tertiary amine polymer, and 0.5 parts by weight to 10 parts by weight of a photoacid initiator. The weight-average molecular weight of the tertiary amine polymer is between 2000 and 20000.

According to several embodiments of the disclosure, the photosensitive adhesive composition of the disclosure has a monomer having a vinyl ether functional group of 30 parts by weight to 70 parts by weight, a tertiary amine polymer of 30 parts by weight to 70 parts by weight, and a photoacid initiator of 1 part by weight to 5 parts by weight.

According to several embodiments of the disclosure, the tertiary amine polymer has the structure represented by formula (1)

formula (1)

In formula (1), $R_1$ and $R_2$ may respectively be a methyl group, an ethyl group, a propyl group, or an isopropyl group, and $R_3$ is a C1 to C5 alkylene group.

$R_4$ is

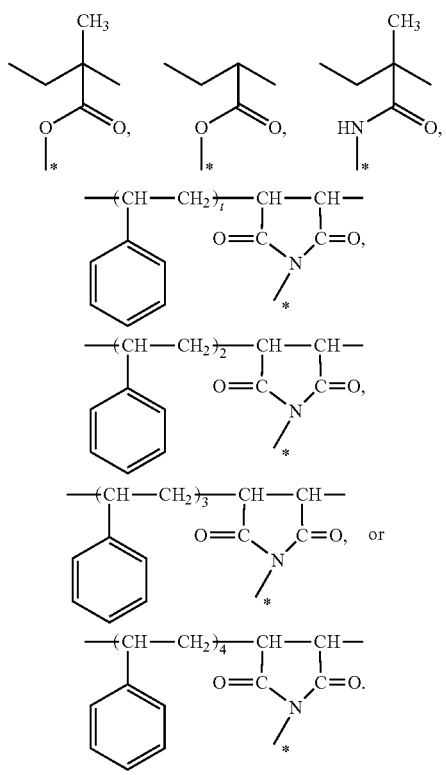

The number n of the repeating unit is an integer between 8 and 132, and * is an end bonded to $R_3$.

According to several embodiments of the disclosure, the monomer having a vinyl ether functional group of the photosensitive adhesive composition of the disclosure has

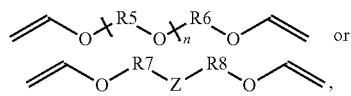

wherein R5, R6, R7, and R8 may respectively be a C1 to C5 alkylene group, n is a positive integer of 1 to 5, and Z may be a C3 to C10 saturated or unsaturated cycloalkyl group or a C6 to C10 aromatic ring.

According to several embodiments of the disclosure, the photoacid initiator of the photosensitive adhesive composition of the disclosure is a diazonium salt, a phosphonium salt, a sulfonium salt, an iodonium salt, a sulfonate compound, or a combination of the above.

According to several embodiments of the disclosure, the photosensitive adhesive composition of the disclosure may further contain a thermally conductive powder or a conductive powder in an amount of 200 parts by weight to 1000 parts by weight. The thermally conductive powder may be a metal oxide, a ceramic, a diamond, a charcoal, boron nitride, aluminum oxide, aluminum nitride, magnesium nitride, zinc oxide, silicon carbide, beryllium oxide, tungsten carbide, or a combination of the above. The conductive powder may be a metal powder or a nano powder (such as silver, copper, gold, aluminum, platinum, nickel, palladium), graphite, graphene, carbon black, carbon nanotube, conductive polymer, metal oxide (such as tin dioxide, aluminum-doped zinc oxide, indium tin oxide), or a combination thereof.

According to several embodiments of the disclosure, a photosensitive adhesive composition of the disclosure includes a conductive powder and a photosensitive adhesive composition. The photosensitive adhesive composition includes 10 parts by weight to 90 parts by weight of a monomer having a vinyl ether functional group, 90 parts by weight to 10 parts by weight of a tertiary amine polymer, and 0.5 parts by weight to 10 parts by weight of a photoacid initiator. The weight-average molecular weight of the tertiary amine polymer is between 2000 and 20000.

According to several embodiments of the disclosure, the tertiary amine polymer has the structure represented by formula (2)

formula (2)

In formula (2), $R_1$ and $R_2$ may respectively be a methyl group, an ethyl group, a propyl group, or an isopropyl group, and $R_3$ is a C1 to C5 alkylene group.

$R_4$ is

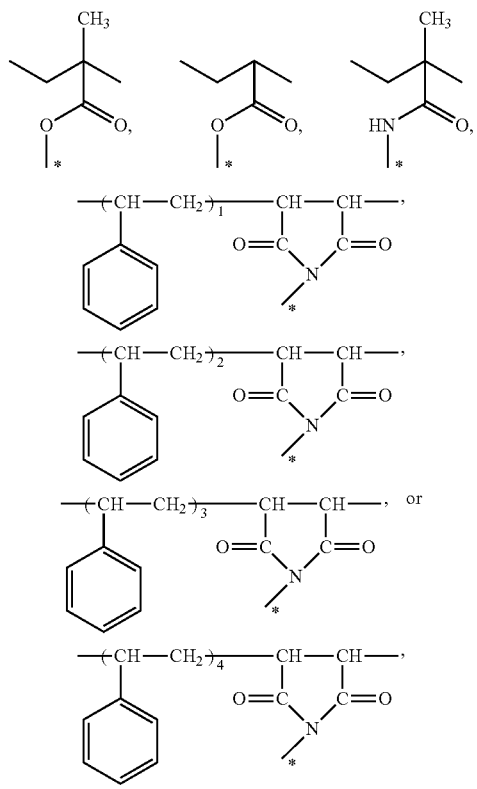

a number n of the repeating unit is an integer between 8 and 132, and * is an end bonded to $R_3$.

According to several embodiments of the disclosure, the monomer having a vinyl ether functional group of the photosensitive conductive adhesive composition of the disclosure has

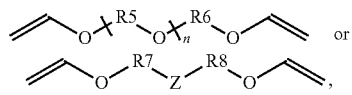

wherein R5, R6, R7, and R8 may respectively be a C1 to C5 alkylene group, n is a positive integer of 1 to 5, and Z may be a C3 to C10 saturated or unsaturated cycloalkyl group or a C6 to C10 aromatic ring.

According to several embodiments of the disclosure, the photoacid initiator of the photosensitive conductive adhesive composition of the disclosure is a diazonium salt, a phosphonium salt, a sulfonium salt, an iodonium salt, a sulfonate compound, or a combination of the above.

According to several embodiments of the disclosure, the conductive powder may be a metal powder or a nano powder (such as silver, copper, gold, aluminum, platinum, nickel, palladium), graphite, graphene, carbon black, a carbon nanotube, a conductive polymer, a metal oxide (such as tin dioxide, aluminum-doped zinc oxide, indium tin oxide), or a combination thereof. According to an embodiment of the disclosure, the conductive powder is added in an amount of 200 parts by weight to 1000 parts by weight.

FIG. 1 is a schematic of an electronic device 10 of an embodiment of the disclosure. The electronic device 10 includes a first substrate 100 having a first electrode 101, a second substrate 200 having a second electrode 201, and a photosensitive conductive adhesive composition 300 disposed between the first substrate 100 and the second substrate 200. The first electrode 101 and the second electrode 201 are electrically connected via the photosensitive conductive adhesive composition 300. The photosensitive conductive adhesive composition includes a photosensitive adhesive composition including 10 parts by weight to 90 parts by weight of a monomer having a vinyl ether functional group, 10 parts by weight to 90 parts by weight of a tertiary amine polymer, 0.5 parts by weight to 10 parts by weight of a photoacid initiator, and conductive particles 301.

According to several embodiments of the disclosure, the tertiary amine polymer has the structure represented by formula (3)

formula (3)

In formula (3), $R_1$ and $R_2$ may respectively be a methyl group, an ethyl group, a propyl group, or an isopropyl group, and $R_3$ is a C1 to C5 alkylene group.

In formula (3), $R_4$ is

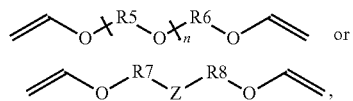

a number n of the repeating unit is an integer between 8 and 132, and * is an end bonded to $R_3$.

According to several embodiments of the disclosure, the monomer having a vinyl ether functional group of the photosensitive conductive adhesive composition of the disclosure has

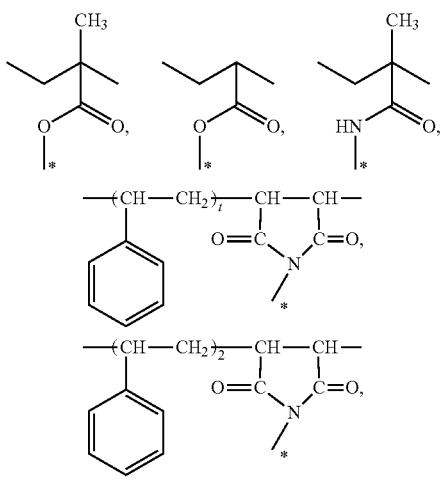

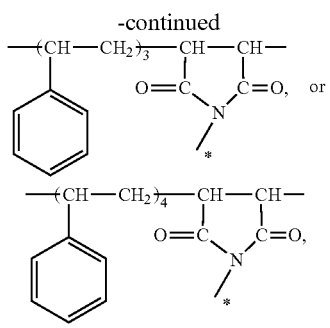

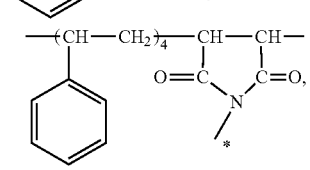

wherein R5, R6, R7, and R8 may respectively be a C1 to C5 alkylene group, n is a positive integer of 1 to 5, and Z may be a C3 to C10 saturated or unsaturated cycloalkyl group or a C6 to C10 aromatic ring.

According to several embodiments of the disclosure, the photoacid initiator of the photosensitive conductive adhesive composition of the disclosure is a diazonium salt, a phosphonium salt, a sulfonium salt, an iodonium salt, a sulfonate compound, or a combination of the above.

According to several embodiments of the disclosure, the conductive particles are added in an amount of 200 parts by weight to 1000 parts by weight.

EXAMPLES

Measuring instruments and methods of product characteristics mentioned in the following examples of the disclosure:

UV irradiation: a UV exposure conveyor included a mercury lamp source, and the UV wavelength range was between 250 nm and 380 nm. Purchased from Sunwheel Materials Co., Ltd. After the UV energy exposure range was adjusted to 635 mJ/cm$^2$ to 3000 mJ/cm$^2$, a sample of the screen-printed photosensitive adhesive composition was placed in the UV exposure conveyor, and when the surface of the photosensitive composition was still in a sticky state, the delayed curing time was recorded.

UV exposure conditions: after UV exposure, when the photosensitive composition surface was still in a sticky state, this exposure condition was regarded as the UV exposure condition of the present photosensitive composition, and the delayed curing time was recorded from this sticky state. For example: the photosensitive composition after screen-printing was exposed to 635 mJ/cm$^2$ to 3000 mJ/cm$^2$ of UV energy, and if the surface of the photosensitive composition still exhibited a sticky state, then the UV energy was regarded as the UV exposure condition, and delayed curing time was recorded.

Adhesiveness measurement method: the adhesive surface was touched by hand to check whether the surface was dry or sticky. If the adhesive surface was dry and not sticky, then the adhesive was cured.

Adhesion measurement method: a standard method of measuring adhesion via a tape test based on ASTM D3359 specification. The test was performed using a 3M Scotch Transparent Film Tape 600 tape, and when the composition surface was tested to be 5B via ASTM D 3359-97, the adhesive had good adhesion to the surface.

Delayed curing time: the delayed curing time involved determining if the photosensitive adhesive was cured according to the surface adhesiveness thereof and recording the time. If the adhesive surface was touched by hand and the surface was dry and not sticky, then the present photosensitive composition was cured.

Regarding the weight-average molecular weight, the molecular weight measuring instrument used was GPC (gel permeation chromatography) purchased from Taian Technology Corporation.

The details of the chemicals used in the following examples and comparative examples of the disclosure are first described as follows:

DEGDE: di(ethylene glycol) divinyl ether purchased from Echo Chemical Co., Ltd.

CHDE: 1,4-cyclohexanedimethanol divinyl ether purchased from Echo Chemical Co., Ltd.

DVETEG: tri(ethylene glycol) divinyl ether purchased from Echo Chemical Co., Ltd.

SMA1000I: styrene-maleic anhydride copolymer purchased from Cheng Ci Corporation.

EPD: ethyl p-(dimethylamino) benzoate purchased from Double Bond Chemical Ind., Co., Ltd.

The chemicals used in each example and comparative example of the disclosure are organized as shown in Table 1 below.

TABLE 1

| Product | Structural formula | Type | Weight-average molecular weight |
|---|---|---|---|
| Di(ethylene glycol) divinyl ether (DEGDE) | | Vinyl ether | 158.19 |
| 1,4-cyclohexanedimethanol divinyl ether (CHDE) | | Vinyl ether | 196.29 |
| Tri(ethylene glycol) divinyl ether (DVETEG) | | Vinyl ether | 202.25 |

TABLE 1-continued

| Product | Structural formula | Type | Weight-average molecular weight |
|---|---|---|---|
| SMA1000I, styrene-maleic anhydride copolymer | (structure shown) | Tertiary amine structure polymer | 3919 |
| Poly(2-(dimethylamino) ethyl methacrylate) (poly(DMA)) | (structure shown) | Tertiary amine structure polymer | 20852 |
| Ethyl p-(dimethylamino) benzoate (EPD) | (structure shown) | Tertiary amine structure molecule | 193.24 |
| 4-isopropyl-4'-methyl-diphenyliodonium tetrakis(pentafluorophenyl) borate | (structure shown) | Photoacid initiator | 1016.25 |

Preparation of Polymer

Example 1

After 70 parts by weight of the DEGDE monomer was added in 30 parts by weight of the SMA1000I copolymer and mixed and dissolved via a planetary centrifugal mixer, 5 parts by weight of the photoacid initiator 4-isopropyl-4'-methyldiphenyliodonium tetrakis(pentafluorophenyl) borate was added in the mixture of SMA1000I copolymer and DEGDE monomer.

Example 2

The same procedures as Example 1 were performed, except that the weights of the SMA1000I copolymer and the DEGDE monomer were both changed to 50 parts by weight.

Example 3

The same procedures as Example 1 were performed, except that the weights of the SMA1000I copolymer and the DEGDE monomer were changed to 70 parts by weight and 30 parts by weight respectively.

Example 4

After 70 parts by weight of the CHDE monomer was added in 30 parts by weight of the SMA1000I copolymer and mixed and dissolved via a planetary centrifugal mixer, 5 parts by weight of the photoacid initiator 4-isopropyl-4'-methyldiphenyliodonium tetrakis(pentafluorophenyl) borate was added in the mixture of SMA1000I copolymer and CHDE monomer.

Example 5

The same procedures as Example 4 were performed, except that the weights of the SMA1000I copolymer and the CHDE monomer were both changed to 50 parts by weight.

Example 6

The same procedures as Example 4 were performed, except that the weights of the SMA1000I copolymer and the CHDE monomer were changed to 70 parts by weight and 30 parts by weight respectively.

Example 7

After 70 parts by weight of DVETEG monomer was added in 30 parts by weight of the SMA1000I copolymer and mixed and dissolved via a planetary centrifugal mixer, 5 parts by weight of the photoacid initiator 4-isopropyl-4'-methyldiphenyliodonium tetrakis(pentafluorophenyl) borate was added in the mixture of SMA1000I copolymer and DVETEG monomer.

Example 8

The same procedures as Example 7 were performed, except that the weights of the SMA1000I copolymer and the DVETEG monomer were both changed to 50 parts by weight.

Example 9

The same procedures as Example 7 were performed, except that the weights of the SMA1000I copolymer and the DVETEG monomer were changed to 70 parts by weight and 30 parts by weight respectively.

Example 10

The SMA1000I copolymer and the DEGDE monomer were both kept at 50 parts by weight, and 3 parts by weight of the photoacid initiator 4-isopropyl-4'-methyl diphenyliodonium tetrakis(pentafluorophenyl) borate was added in the mixture of SMA1000I copolymer and DEGDE monomer.

Example 11

The SMA1000I copolymer and the DEGDE monomer were both kept at 50 parts by weight, and 1 part by weight of the photoacid initiator 4-isopropyl-4'-methyl diphenyliodonium tetrakis(pentafluorophenyl) borate was added in the mixture of SMA1000I copolymer and DEGDE monomer.

Example 12

The SMA1000I copolymer and the CHDE monomer were both kept at 50 parts by weight, and 3 parts by weight of the photoacid initiator 4-isopropyl-4'-methyl diphenyliodonium tetrakis(pentafluorophenyl) borate was added in the mixture of SMA1000I copolymer and CHDE monomer.

Example 13

The SMA1000I copolymer and the CHDE monomer were both kept at 50 parts by weight, and 1 part by weight of the photoacid initiator 4-isopropyl-4'-methyl diphenyliodonium tetrakis(pentafluorophenyl) borate was added in the mixture of SMA1000I copolymer and CHDE monomer.

Example 14

The SMA1000I copolymer and the DEVTEG monomer were both kept at 50 parts by weight, and 3 parts by weight of the photoacid initiator 4-isopropyl-4'-methyl diphenyliodonium tetrakis(pentafluorophenyl) borate was added in the mixture of SMA1000I copolymer and DEVTEG monomer.

Example 15

The SMA1000I copolymer and the DEVTEG monomer were both kept at 50 parts by weight, and 1 part by weight of the photoacid initiator 4-isopropyl-4'-methyl diphenyliodonium tetrakis(pentafluorophenyl) borate was added in the mixture of SMA1000I copolymer and DEVTEG monomer.

Example 16

Synthesis of Polymer Poly(DMA) Having Tertiary Amine Structure 15 g of a 2-(dimethylamino) ethyl methacrylate (DMA) monomer was mixed with 18 g of a solvent PMA, and AIBN was added in the reaction system at 1 wt % of the DMA. Synthesis was performed in a 90° C. environment for 4 hours, and the weight-average molecular weight of the synthesized polymer was about 20852.

After 50 parts by weight of the DEGDE monomer was added in 50 parts by weight of a self-synthesized poly (DMA) polymer and dissolved via a planetary centrifugal mixer, 5 parts by weight of the photoacid initiator 4-isopropyl-4'-methyldiphenyliodonium tetrakis(pentafluorophenyl) borate was added in the mixture of poly(DMA) and DEGDE monomer.

Example 17

After 50 parts by weight of the CHDE monomer was added in 50 parts by weight of the poly(DMA) polymer and mixed and dissolved via a planetary centrifugal mixer, 5 parts by weight of the photoacid initiator 4-isopropyl-4'-methyldiphenyliodonium tetrakis(pentafluorophenyl) borate was added in the mixture of poly(DMA) polymer and CHDE monomer.

Example 18

After 50 parts by weight of the DVETEG monomer was added in 50 parts by weight of the poly(DMA) polymer and mixed and dissolved via a planetary centrifugal mixer, 5 parts by weight of the photoacid initiator was added in the mixture of poly(DMA) polymer and DVETEG monomer.

Example 19

The procedures and the weights of the vinyl ether monomer and the tertiary amine structure polymer were the same as Example 1, except that extra 400 parts by weight of silver flakes were added.

Example 20

The procedures and the weights of the vinyl ether monomer and the tertiary amine structure polymer were the same as Example 2, except that extra 400 parts by weight of silver flakes were added.

Example 21

The procedures and the weights of the vinyl ether monomer and the tertiary amine structure polymer were the same as Example 3, except that extra 400 parts by weight of silver flakes were added.

Example 22

The procedures and the weights of the vinyl ether monomer and the tertiary amine structure polymer were the same as Example 4, except that extra 400 parts by weight of silver flakes were added.

Example 23

The procedures and the weights of the vinyl ether monomer and the tertiary amine structure polymer were the same as Example 5, except that extra 400 parts by weight of silver flakes were added.

Example 24

The procedures and the weights of the vinyl ether monomer and the tertiary amine structure polymer were the same as Example 6, except that extra 400 parts by weight of silver flakes were added.

Example 25

The procedures and the weights of the vinyl ether monomer and the tertiary amine structure polymer were the same as Example 7, except that extra 400 parts by weight of silver flakes were added.

Example 26

The procedures and the weights of the vinyl ether monomer and the tertiary amine structure polymer were the same as Example 8, except that extra 400 parts by weight of silver flakes were added.

Example 27

The procedures and the weights of the vinyl ether monomer and the tertiary amine structure polymer were the same as Example 9, except that extra 400 parts by weight of silver flakes were added.

Comparative Example 1

5 parts by weight of the photoacid initiator 4-isopropyl-4'-methyldiphenyliodonium tetrakis(pentafluorophenyl) borate was added in 100 parts by weight of the di(ethylene glycol) divinyl ether (DEGDE) monomer and mixed and dissolved via a planetary centrifugal mixer to complete the preparation of the photosensitive composition.

Comparative Example 2

5 parts by weight of the photoacid initiator 4-isopropyl-4'-methyldiphenyliodonium tetrakis(pentafluorophenyl) borate was added in 100 parts by weight of the 1,4-cyclohexane dimethanol divinyl ether (CHDE) monomer and mixed and dissolved via a planetary centrifugal mixer to complete the preparation of the photosensitive composition.

Comparative Example 3

5 parts by weight of the photoacid initiator 4-isopropyl-4'-methyldiphenyliodonium tetrakis(pentafluorophenyl) borate was added in 100 parts by weight of the tri(ethylene glycol) divinyl ether (DVETEG) monomer and mixed and dissolved via a planetary centrifugal mixer to complete the preparation of the photosensitive composition.

Comparative Example 4

After 70 parts by weight of the DVETEG monomer was added in 30 parts by weight of the ethyl p-(dimethylamino) benzoate (EPD) tertiary amine structure molecule and mixed and dissolved via a planetary centrifugal mixer, 5 parts by weight of the photoacid initiator 4-isopropyl-4'-methyldiphenyliodonium tetrakis(pentafluorophenyl) borate was added in the mixture of EPD tertiary amine structure molecule and the DVETEG monomer.

Comparative Example 5

The same procedures as Comparative example 4 were performed, except that the weights of the EPD molecule and the DVETEG monomer were both changed to 50 parts by weight.

Comparative Example 6

The same procedures as Comparative example 4 were performed, except that the weights of the EPD molecule and the DVETEG monomer were changed to 70 parts by weight and 30 parts by weight respectively.

The composition and photosensitive composition characteristics of each example and comparative example are shown in Table 2.

TABLE 2

| Photo-sensitive composition ratio | Vinyl ether monomer (parts by weight) | | | Tertiary amine structure polymer (parts by weight) | | Tertiary amine structure molecule | Photoacid initiator (parts by weight) | UV exposure conditions (mJ/cm$^2$) | Delayed curing time | Adhesiveness | Adhesion |
|---|---|---|---|---|---|---|---|---|---|---|---|
| | DEGDE | CHDE | DVETEG | SMA1000I | Poly(DMA) | EPD | | | | | |
| Example 1 | 70 | — | — | 30 | — | — | 5 | 893 | 1 hour | Dry and not sticky | 5 B |
| Example 2 | 50 | — | — | 50 | — | — | 5 | Room temperature | 30 minutes | Dry and not sticky | 5 B |
| Example 3 | 30 | — | — | 70 | — | — | 5 | Room temperature | 10 minutes | Dry and not sticky | 5 B |
| Example 4 | — | 70 | — | 30 | — | — | 5 | 3000 | 30 minutes | Dry and not sticky | 5 B |
| Example 5 | — | 50 | — | 50 | — | — | 5 | 1444 | 40 minutes | Dry and not sticky | 5 B |
| Example 6 | — | 30 | — | 70 | — | — | 5 | 635 | 30 minutes | Dry and not sticky | 5 B |
| Example 7 | — | — | 70 | 30 | — | — | 5 | 2090 | 1.5 hours | Dry and not sticky | 5 B |
| Example 8 | — | — | 50 | 50 | — | — | 5 | 1444 | 1.5 hours | Dry and not sticky | 5 B |
| Example 9 | — | — | 30 | 70 | — | — | 5 | 761 | 40 minutes | Dry and not sticky | 5 B |
| Example 10 | 50 | — | — | 50 | — | — | 3 | Room temperature | 40 minutes | Dry and not sticky | 5 B |
| Example 11 | 50 | — | — | 50 | — | — | 1 | Room temperature | 45 minutes | Dry and not sticky | 5 B |
| Example 12 | — | 50 | — | 50 | — | — | 3 | 1444 | 50 minutes | Dry and not sticky | 5 B |
| Example 13 | — | 50 | — | 50 | — | — | 1 | 1093 | 30 minutes | Dry and not sticky | 5 B |
| Example 14 | — | — | 50 | 50 | — | — | 3 | 1800 | 2 hours | Dry and not sticky | 5 B |
| Example 15 | — | — | 50 | 50 | — | — | 1 | 1444 | 4 hours | Dry and not sticky | 5 B |
| Example 16 | 50 | — | — | — | 50 | — | 5 | 3000 | 20 minutes | Dry and not sticky | 5 B |
| Example 17 | — | 50 | — | — | 50 | — | 5 | 2090 | 30 minutes | Dry and not sticky | 5 B |
| Example 18 | — | — | 50 | — | 50 | — | 5 | 2090 | 1 hours | Dry and not sticky | 5 B |

TABLE 3

| Photosensitive composition ratio | Vinyl ether monomer (parts by weight) | | | Tertiary amine structure polymer (parts by weight) | | Tertiary amine structure molecule | Photoacid initiator (parts by weight) |
|---|---|---|---|---|---|---|---|
| | DEGDE | CHDE | DVETEG | SMA1000I | Poly(DMA) | EPD | |
| Example 19 | 70 | — | — | 30 | — | — | 5 |
| Example 20 | 50 | — | — | 50 | — | — | 5 |
| Example 21 | 30 | — | — | 70 | — | — | 5 |
| Example 22 | — | 70 | — | 30 | — | — | 5 |
| Example 23 | — | 50 | — | 50 | — | — | 5 |
| Example 24 | — | 30 | — | 70 | — | — | 5 |
| Example 25 | — | — | 70 | 30 | — | — | 5 |
| Example 26 | — | — | 50 | 50 | — | — | 5 |
| Example 27 | — | — | 30 | 70 | — | — | 5 |

| Photosensitive composition ratio | UV exposure conditions (mJ/cm$^2$) | Delayed curing time | Adhesiveness | Adhesion | Amount of silver flakes (parts by weight) | Surface resistivity (Ohm · cm) |
|---|---|---|---|---|---|---|
| Example 19 | 893 | 1 hour | Dry and not sticky | 5 B | 400 | $2.4 \times 10^{-4}$ |
| Example 20 | Room temperature | 30 minutes | Dry and not sticky | 5 B | 400 | $2.3 \times 10^{-4}$ |
| Example 21 | Room temperature | 10 minutes | Dry and not sticky | 5 B | 400 | $1.0 \times 10^{-3}$ |
| Example 22 | 3000 | 30 minutes | Dry and not sticky | 5 B | 400 | $1.2 \times 10^{-4}$ |

TABLE 3-continued

| Example 23 | 1444 | 40 minutes | Dry and not sticky | 5 B | 400 | $4.0 \times 10^{-4}$ |
| Example 24 | 635 | 30 minutes | Dry and not sticky | 5 B | 400 | $5.2 \times 10^{-3}$ |
| Example 25 | 2090 | 1.5 hours | Dry and not sticky | 5 B | 400 | $2.1 \times 10^{-4}$ |
| Example 26 | 1444 | 1.5 hours | Dry and not sticky | 5 B | 400 | $2.6 \times 10^{-4}$ |
| Example 27 | 761 | 40 minutes | Dry and not sticky | 5 B | 400 | $1.5 \times 10^{-4}$ |

TABLE 4

| Photo-sensitive composition ratio | Vinyl ether monomer (parts by weight) | | | Tertiary amine structure polymer (parts by weight) | | Tertiary amine structure molecule (parts by weight) | Photoacid initiator (parts by weight) | UV exposure conditions ($mJ/cm^2$) | Delayed curing time | Adhesive-ness | Adhe-sion |
|---|---|---|---|---|---|---|---|---|---|---|---|
| | DEGDE | CHDE | DVETEG | SMA1000I | Poly(DMA) | EPD | | | | | |
| Comparative example 1 | 100 | — | — | — | — | — | 5 | Room temperature | None (Intense reaction, adhesive burned and carbonized) | Dry and not sticky | 0 B (brittle) |
| Comparative example 2 | — | 100 | — | — | — | — | 5 | 635 | None (rapid curing) | Dry and not sticky | 5 B |
| Comparative example 3 | — | — | 100 | — | — | — | 5 | Room temperature | None (Intense reaction, adhesive burned and carbonized) | Dry and not sticky | 0 B (brittle) |
| Comparative example 4 | — | — | 70 | — | — | 30 | 5 | 2090 to 4000 | More than 24 hours | Sticky | 0 B |
| Comparative example 5 | — | — | 50 | — | — | 50 | 5 | 2090 to 4000 | More than 24 hours | Sticky | 0 B |
| Comparative example 6 | — | — | 30 | — | — | 70 | 5 | 2090 to 4000 | More than 24 hours | Sticky | 0 B |

Tables 1 and 2 contain the components of the photosensitive delayed curing compositions of Examples 1 to 18 and Table 4 shows the components of the photosensitive delayed curing compositions of Comparative Examples 1 to 6, and all the measurement units are parts by weight.

The examples and the comparative examples show that, in Examples 1 to 9, at the same 5% addition ratio of the photoacid initiator, the addition of monomers having a vinyl ether functional group with different parts by weight and different structures in the photosensitive adhesive composition, such as DEGDE, CHDE, DVETEG and the tertiary amine structure polymer SMA1000I, may all show the effect of delayed curing.

In Examples 10 to 15, different structures of monomers having a vinyl ether functional group and different structures of the tertiary amine structure polymer SMA1000I were both 50 parts by weight, 1 part by weight or 3 parts by weight of the photoacid initiator was added. The results show that the photosensitive adhesive compositions of Examples 10 to 15 also had a delayed curing effect.

In Examples 16 to 18, 50 parts by weight of a self-synthesized tertiary amine polymer structure poly(DMA) was respectively mixed with 50 parts by weight of three different monomers having a vinyl ether structure to form a photosensitive adhesive composition. The results also show the characteristic of delayed curing.

According to the results of Examples 1 to 18, when the composition had both a vinyl ether functional group structure and a tertiary amine structure polymer, the monomer having a vinyl ether functional group was 30 parts by weight to 70 parts by weight, the tertiary amine polymer was 30 parts by weight to 70 parts by weight, and the photoacid initiator was 1 part by weight to 5 parts by weight, such that the photosensitive composition had a delayed curing characteristic.

In Comparative examples 1 to 3, it is seen that without adding a tertiary amine polymer structure and at the same addition ratio of the photoacid initiator, the photosensitive adhesive composition formed by the monomer having a vinyl ether functional group and a photoacid initiator was cured rapidly, and some cases even showed intense reactions resulting in carbonized adhesive. Therefore, if only the monomer having a vinyl ether functional group and the photoacid initiator were used to form the photosensitive adhesive composition, then the delayed curing effect of the disclosure was not achieved.

The difference between the photosensitive adhesive compositions of Examples 7 to 9 and Comparative examples 4 to 6 is the use of a tertiary amine structure polymer or a tertiary amine structure molecule, and the results show that the delayed curing effect, adhesiveness, and adhesion are all better when a tertiary amine structure polymer was used than when a tertiary amine structure molecule was used. This is because the molecular weight and the volume effect per unit area of the tertiary amine structure polymer are both greater than those of the tertiary amine molecule used in the previous application, and therefore the delayed curing effect, adhesiveness, and adhesion are all better. In addition, under the UV energy exposure evaluation, when the photosensitive adhesive formed by the tertiary amine structure molecule was exposed to a higher UV energy of 4000 mJ/cm² for one day or more, the adhesive surface still showed a sticky state, and the result of 0B was also measured in the adhesion evaluation. Compared to the photosensitive adhesive formed by the tertiary amine structure polymer of the disclosure, the exposure energy was significantly higher, and more energy and time were required.

In Examples 19 to 27, when the photoacid initiator was added in the same amount of 5 parts by weight, the monomer having a vinyl ether functional group was added in the photosensitive adhesive composition in different parts by weight and different structures, such as DEGDE, CHDE, DVETEG, and the tertiary amine structure polymer SMA1000I, and the surface resistivity thereof was measured, which was about $1.2 \times 10^{-4}$ ohm·cm to $5.2 \times 10^{-3}$ ohm·cm, which is comparable to the resistivity of $10^{-4}$ ohm·cm of the commercially available conductive adhesive from the Japanese TANAKA manufacturer.

In Comparative examples 4 to 6, when the original tertiary amine polymer structure was changed to a molecule having a tertiary amine structure, the photosensitive composition formed by the tertiary amine molecule was cured without delay at different addition ratios. After being left in a room temperature environment for one day or more, the adhesive surface still showed a sticky state, and the adhesion on the substrate was also deteriorated, and the test result was 0B via ASTM D 3359-97.

Therefore, the disclosure may successfully improve the adhesion of the small molecule tertiary amine structure via the tertiary amine structure polymer, and may delay the addition reaction of the double bond in vinyl ether by the photoacid initiator cation in a photoacid initiator environment to achieve the effect of delayed curing of the photosensitive composition.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A photosensitive adhesive composition, comprising:
   10 parts by weight to 90 parts by weight of a monomer having a vinyl ether functional group;
   10 parts by weight to 90 parts by weight of a tertiary amine polymer; and
   0.5 parts by weight to 10 parts by weight of a photoacid initiator,
   wherein a weight-average molecular weight of the tertiary amine polymer is between 2000 and 20000,
   wherein the tertiary amine polymer has a structure represented by formula (1)

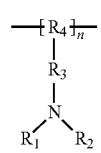

formula (1)

wherein $R_1$ and $R_2$ are respectively a methyl group, an ethyl group, a propyl group, or an isopropyl group, and $R_3$ is a C1 to C5 alkylene group,
$R_4$ is

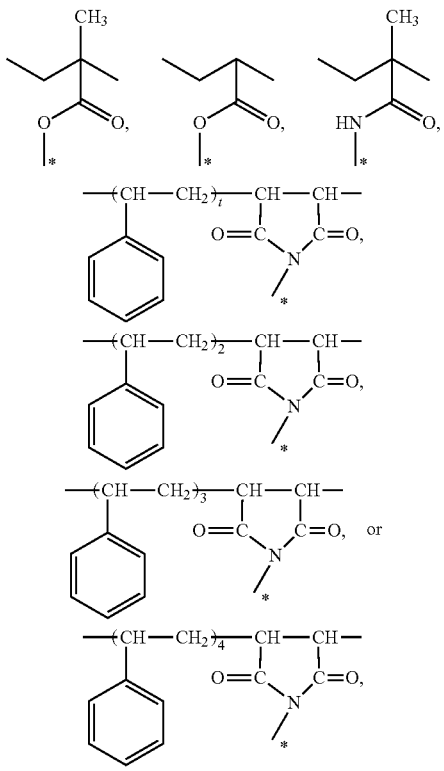

a number n of a repeating unit is an integer between 8 and 132, and * is an end bonded to $R_3$.

2. The photosensitive adhesive composition of claim 1, wherein
the monomer having the vinyl ether functional group is 30 parts by weight to 70 parts by weight, the tertiary amine polymer is 30 parts by weight to 70 parts by weight, and the photoacid initiator is 1 part by weight to 5 parts by weight.

3. The photosensitive adhesive composition of claim 1, wherein the monomer having the vinyl ether functional group has a structure represented by formula (2) or formula (3)

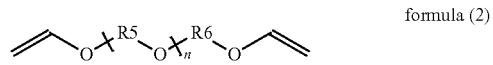

formula (2)

formula (3)

wherein R5, R6, R7, and R8 are respectively a C1 to C5 alkylene group, n is a positive integer of 1 to 5, and Z is a C3 to C10 saturated or unsaturated cycloalkyl group or a C6 to C10 aromatic ring.

4. The photosensitive adhesive composition of claim 1, wherein the photoacid initiator is a diazonium salt, a phosphonium salt, a sulfonium salt, an iodonium salt, a sulfonate compound, or a combination of the above.

5. The photosensitive adhesive composition of claim 1, further comprising a thermally conductive powder.

6. The photosensitive adhesive composition of claim 5, wherein the thermally conductive powder is 200 parts by weight to 1000 parts by weight.

7. The photosensitive adhesive composition of claim 6, wherein the thermally conductive powder is a metal oxide, a ceramic, a diamond, a charcoal, boron nitride, aluminum oxide, aluminum nitride, magnesium nitride, zinc oxide, silicon carbide, beryllium oxide, tungsten carbide, or a combination of the above.

8. A photosensitive conductive adhesive composition, comprising:
a conductive powder; and the photosensitive adhesive composition of claim 1.

9. The photosensitive adhesive composition of claim 8, wherein the conductive powder is 200 parts by weight to 1000 parts by weight.

10. The photosensitive conductive adhesive composition of claim 8, wherein the conductive powder is a metal powder, a nano powder, graphite, graphene, carbon black, a carbon nanotube, a conductive polymer, a metal oxide, or a combination of the above.

11. The photosensitive conductive adhesive composition of claim 10, wherein the nano powder is silver, copper, gold, aluminum, platinum, nickel, palladium, or a combination of the above.

12. The photosensitive conductive adhesive composition of claim 10, wherein the metal oxide is tin dioxide, aluminum-doped zinc oxide, indium tin oxide, or a combination of the above.

13. The photosensitive adhesive composition of claim 8, wherein
the monomer having the vinyl ether functional group is 30 parts by weight to 70 parts by weight, the tertiary amine polymer is 30 parts by weight to 70 parts by weight, and the photoacid initiator is 1 part by weight to 5 parts by weight.

14. The photosensitive adhesive composition of claim 8, wherein the monomer having the vinyl ether functional group has a structure represented by formula (2) or formula (3)

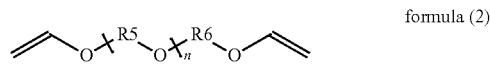
formula (2)

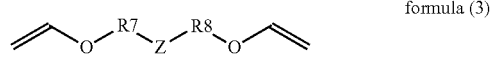
formula (3)

wherein R5, R6, R7, and R8 are respectively a C1 to C5 alkylene group, n is a positive integer of 1 to 5, and Z is a C3 to C10 saturated or unsaturated cycloalkyl group or a C6 to C10 aromatic ring.

15. The photosensitive adhesive composition of claim 8, wherein the photoacid initiator is a diazonium salt, a phosphonium salt, a sulfonium salt, an iodonium salt, a sulfonate compound, or a combination of the above.

16. An electronic device, comprising:
a first substrate having a first electrode;
a second substrate having a second electrode; and
the photosensitive conductive adhesive composition of claim 8 disposed between the first substrate and the second substrate, and the first electrode and the second electrode are electrically connected via the photosensitive conductive adhesive composition.

* * * * *